United States Patent
Lee et al.

(10) Patent No.: US 10,319,462 B2
(45) Date of Patent: Jun. 11, 2019

(54) SEMICONDUCTOR DEVICE AND SEMICONDUCTOR SYSTEM

(71) Applicant: SK hynix Inc., Icheon-si Gyeonggi-do (KR)

(72) Inventors: Do Yun Lee, Yongin-si (KR); Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 302 days.

(21) Appl. No.: 15/257,164

(22) Filed: Sep. 6, 2016

(65) Prior Publication Data

US 2017/0371745 A1 Dec. 28, 2017

(30) Foreign Application Priority Data

Jun. 23, 2016 (KR) .................. 10-2016-0078820

(51) Int. Cl.
| | |
|---|---|
| G11C 7/04 | (2006.01) |
| G11C 29/52 | (2006.01) |
| G11C 7/10 | (2006.01) |
| G11C 11/4076 | (2006.01) |
| G06F 11/10 | (2006.01) |
| G11C 5/14 | (2006.01) |
| G11C 7/24 | (2006.01) |
| G11C 11/4074 | (2006.01) |
| G11C 29/04 | (2006.01) |

(52) U.S. Cl.
CPC ............ *G11C 29/52* (2013.01); *G06F 11/106* (2013.01); *G11C 7/04* (2013.01); *G11C 7/1006* (2013.01); *G11C 11/4076* (2013.01); *G11C 5/14* (2013.01); *G11C 7/24* (2013.01); *G11C 11/4074* (2013.01); *G11C 2029/0409* (2013.01)

(58) Field of Classification Search
CPC .... G06F 3/0688; G06F 3/0619; G06F 11/106; G11C 29/52; G11C 11/4076; G11C 7/1006; G11C 7/04; G11C 5/14; G11C 2029/0409; G11C 7/24; G11C 11/4074
USPC .......................................................... 714/764
See application file for complete search history.

(56) References Cited

U.S. PATENT DOCUMENTS

| | | | | |
|---|---|---|---|---|
| 9,197,217 | B2 * | 11/2015 | Yamada | .................... H03L 1/02 |
| 2006/0126204 | A1 * | 6/2006 | Taniguchi | ........ G11B 20/10009 360/31 |
| 2010/0005366 | A1 * | 1/2010 | Dell | ...................... G06F 11/073 714/758 |
| 2012/0224425 | A1 | 9/2012 | Fai et al. | |
| 2013/0080680 | A1 * | 3/2013 | Chu | .......................... G11C 7/04 711/102 |
| 2014/0082255 | A1 * | 3/2014 | Powell | ................. G11B 33/144 711/102 |

FOREIGN PATENT DOCUMENTS

KR 1020160016051 A 2/2016

* cited by examiner

*Primary Examiner* — Samir W Rizk
*Assistant Examiner* — Enam Ahmed
(74) *Attorney, Agent, or Firm* — William Park & Associates Ltd.

(57) ABSTRACT

A semiconductor device may include an operation control circuit configured to generate a detection signal based on an internal temperature of the semiconductor device. The semiconductor device may include an error correction circuit configured to output read data as output data with or without performing an error correction operation and with or without performing a scrub operation based on the detection signal.

29 Claims, 5 Drawing Sheets

SEMICONDUCTOR DEVICE AND SEMICONDUCTOR SYSTEM

CROSS-REFERENCE TO RELATED APPLICATION

The present application claims priority under 35 U.S.C. § 119(a) to Korean Patent Application No. 10-2016-0078820 filed on Jun. 23, 2016 in the Korean Intellectual Property Office, which is incorporated herein by reference in its entirety.

BACKGROUND

1. Technical Field

Embodiments of the present disclosure may generally relate to a semiconductor system including a semiconductor device configured to perform an error correction operation.

2. Related Art

Recently, in order to increase the operating speed of a semiconductor device, a DDR2 or DDR3 signaling is used, in which 4-bit or 8-bit data is inputted and outputted within each clock cycle. Where an input/output speed of data is increased, the probability of an error occurring during a data transmission process increases. Therefore, a separate device and method for ensuring the reliability of data transmission are additionally demanded.

There is disclosed a method of generating, at each time of transmitting data, error codes capable of checking the occurrence of an error and transmitting the error codes with data, thereby ensuring the reliability of data transmission. The error codes include an error detection code capable of detecting an error occurred and an error correction code capable of correcting, by itself, an error when it has occurred.

SUMMARY

In an embodiment, a semiconductor device may be provided. The semiconductor device may include an operation control circuit configured to generate a detection signal based on an internal temperature of the semiconductor device. The semiconductor device may include an error correction circuit configured to output read data as output data with or without performing an error correction operation and with or without performing a scrub operation based on the detection signal.

In an embodiment, a semiconductor device may include an operation control circuit configured to generate a detection signal based on a level of a core voltage of the semiconductor device. The semiconductor device may include an error correction circuit configured to output read data as output data with or without performing an error correction operation and with or without performing a scrub operation based on the detection signal.

In an embodiment, a semiconductor device may include an operation control circuit configured to generate a detection signal based on an internal temperature of the semiconductor device. The semiconductor device may include an error correction circuit configured to output read data as output data with or without performing an error correction operation and with or without performing a scrub operation based on the detection signal. The error correction circuit is configured to output the read data as the output data without performing the error correction operation and without performing the scrub operation when the internal temperature is below a first predetermined temperature. The error correction circuit is configured to output the read data as the output data with performing the error correction operation and without performing the scrub operation when the internal temperature is greater than or equal to a first predetermined temperature and less than a second predetermined temperature and the second predetermined temperature is set to be greater than the first predetermined temperature. The error correction circuit is configured to output the read data as the output data with performing the error correction operation and with performing the scrub operation when the internal temperature is greater than a first and a second predetermined temperature the error correction circuit is configured to output the read data as the output data with performing the error correction operation and with performing the scrub operation and the second predetermined temperature is set to be greater than the first predetermined temperature. The error correction operation includes correcting an error of the read data according to a read parity and generating the output data and the scrub operation includes generating scrub data by buffering the output data In an embodiment, a semiconductor device may include an operation control circuit configured to generate a detection signal based on a level of a core voltage of the semiconductor device. The semiconductor device may include error correction circuit configured to output read data as output data with or without performing an error correction operation and with or without performing a scrub operation based on the detection signal. The error correction circuit is configured to output the read data as the output data without performing the error correction operation and without performing the scrub operation when the level of the core voltage is equal to or higher than a reference voltage. The error correction circuit is configured to output the read data as the output data with performing the error correction operation and without performing the scrub operation when the level of the core voltage is lower, by a level equal to or lower than the level of a predetermined voltage, than a reference voltage. The error correction circuit is configured to output the read data as the output data with performing the error correction operation and with performing the scrub operation when the level of the core voltage is lower, by a level higher than the level of the predetermined voltage, than the reference voltage. The error correction operation includes correcting an error of the read data according to a read parity and generating the output data and the scrub operation includes generating scrub data by buffering the output data.

In an embodiment, a semiconductor system may be provided. The semiconductor system may include a first semiconductor device configured for outputting a command and being inputted with output data. The semiconductor system may include a second semiconductor device configured for generating an error correction control signal and a scrub control signal depending upon an internal temperature or a level of a core voltage, and generating the output data by correcting an error of read data according to a read parity based on the error correction control signal, based on a read operation being performed based on the command.

DETAILED DESCRIPTION

Hereinafter, a semiconductor device and a semiconductor system will be described below with reference to the accompanying drawings through various examples of embodiments.

Various embodiments may be directed to a semiconductor system including a semiconductor device which performs an error correction operation depending on an internal temperature or the level of a core voltage.

According to the embodiments, advantages may be provided in that, since an error correction operation and a scrub operation are not performed in the case where an internal temperature is low, unnecessary current consumption may be substantially prevented, and, since an error correction operation and a scrub operation are performed in the case where an internal temperature is high, reliability of the data may be improved.

Figure 1:
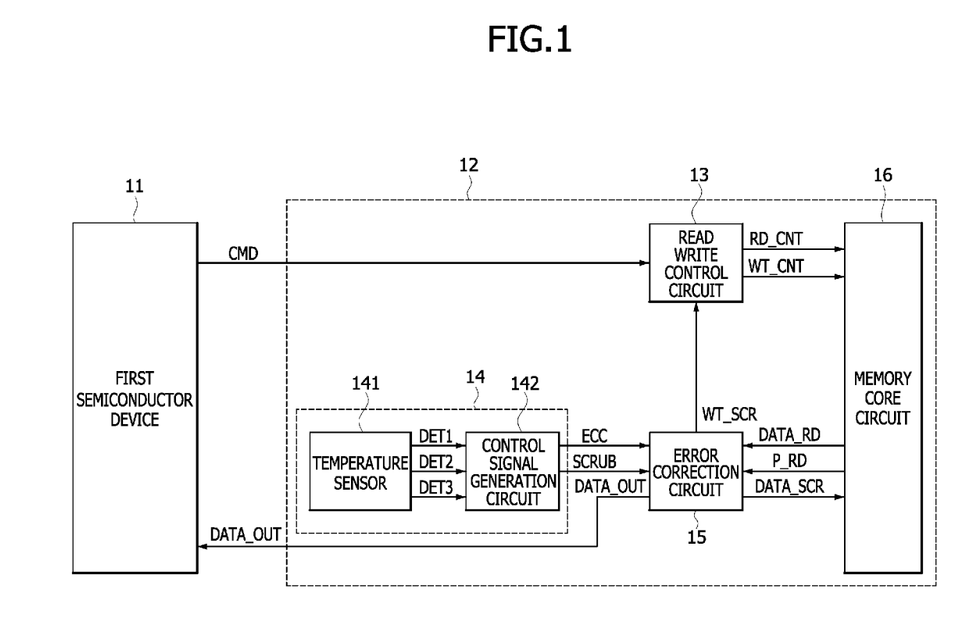
FIG. 1 is a block diagram illustrating a representation of an example of the configuration of a semiconductor system in accordance with an embodiment.

Also, according to the embodiments, advantages may be provided in that, since an error correction operation and a scrub operation are not performed in the case where the level of a core voltage is high, unnecessary current consumption may be substantially prevented, and, since an error correction operation and a scrub operation are performed in the case where the level of a core voltage is low, reliability of the data may be improved Referring to FIG. 1, a semiconductor system in accordance with an embodiment may include a first semiconductor device 11 and a second semiconductor device 12.

The first semiconductor device 11 may output a command CMD. The command CMD may include a plurality of bits according to an embodiment. The bits included in the command CMD may have logic level combinations corresponding to a read operation, a write operation and a refresh operation of the second semiconductor device 12. The command CMD may be transmitted through the same transmission line as an address (not illustrated), or may be transmitted through a separate transmission line from an address. The first semiconductor device 11 may be inputted with output data DATA_OUT. The output data DATA_OUT may be data outputted from the second semiconductor device 12 in the case where a read operation for the second semiconductor device 12 is performed.

The second semiconductor device 12 may include a read write control circuit 13, an operation control circuit 14, an error correction circuit 15, and a memory core circuit 16.

The read write control circuit 13 may decode the command CMD, and generate a read control signal RD_CNT and a write control signal WT_CNT. The read write control circuit 13 may decode the command CMD, and generate the read control signal RD_CNT which is enabled in the case where a read operation is to be performed. The read write control circuit 13 may decode the command CMD, and generate the write control signal WT_CNT which is enabled in the case where a write operation is to be performed. The read write control circuit 13 may generate the write control signal WT_CNT in response to a scrub write control signal WT_SCR. The read write control circuit 13 may generate the write control signal WT_CNT which is enabled in the case where the scrub write control signal WT_SCR is enabled.

The operation control circuit 14 may include a temperature sensor 141 and a control signal generation circuit 142.

The temperature sensor 141 may generate first to third detection signals DET1, DET2 and DET3 which are enabled depending upon an internal temperature. The temperature sensor 141 may generate the first detection signal DET1 which is enabled in the case where an internal temperature is lower than a first predetermined temperature. The temperature sensor 141 may generate the second detection signal DET2 which is enabled in the case where an internal temperature is equal to or higher than the first predetermined temperature and is lower than a second predetermined temperature. The second predetermined temperature may be a temperature higher than the first predetermined temperature. The temperature sensor 141 may generate the third detection signal DET3 which is enabled in the case where an internal temperature is equal to or higher than the second predetermined temperature. For example, in the case where the first predetermined temperature is set to 25° C. and the second predetermined temperature is set to 45° C., the temperature sensor 141 may generate the first detection signal DET1 which is enabled when an internal temperature is lower than 25° C., generate the second detection signal DET2 which is enabled when an internal temperature is equal to or higher than 25° C. and is lower than 45° C., and generate the third detection signal DET3 which is enabled when an internal temperature is equal to or higher than 45° C. Temperatures corresponding to the first predetermined temperature and the second predetermined temperature may be set variously depending upon an embodiment.

The control signal generation circuit 142 may generate an error correction control signal ECC and a scrub control signal SCRUB in response to the first to third detection signals DET1, DET2 and DET3. The control signal generation circuit 142 may generate the error correction control signal ECC and the scrub control signal SCRUB which are disabled in both, in the case where the first detection signal DET1 is enabled. The control signal generation circuit 142 may generate the error correction control signal ECC which is enabled and the scrub control signal SCRUB which is disabled, in the case where the second detection signal DET2 is enabled. The control signal generation circuit 142 may generate the error correction control signal ECC and the scrub control signal SCRUB which are enabled in both, in the case where the third detection signal DET3 is enabled. According to an embodiment, the control signal generation circuit 142 may generate the error correction control signal ECC which is disabled and the scrub control signal SCRUB which is enabled, in the case where the second detection signal DET2 is enabled.

The operation control circuit 14 may generate the error correction control signal ECC which is enabled in the case where an internal temperature is equal to or higher than the first predetermined temperature. The operation control circuit 14 may generate the scrub control signal SCRUB which is enabled in the case where an internal temperature is equal to or higher than the second predetermined temperature.

The error correction circuit 15 may receive read data DATA_RD and a read parity P_RD in response to the error correction control signal ECC and the scrub control signal SCRUB, and generate the output data DATA_OUT, scrub data DATA_SCR and the scrub write control signal WT_SCR. The error correction circuit 15 may buffer the read data DATA_RD without correcting it and output the output data DATA_OUT, in the case where the error correction control signal ECC is disabled. The error correction circuit 15 may correct an error of the read data DATA_RD according to the read parity P_RD and generate the output data DATA_OUT, in the case where the error correction control signal ECC is enabled. The error correction circuit 15 may generate the scrub write control signal WT_SCR and generate the scrub data DATA_SCR by buffering the output data DATA_OUT, in the case where the scrub control signal SCRUB is enabled.

The memory core circuit 16 may output the read data DATA_RD and the read parity P_RD or be inputted with the scrub data DATA_SCR in response to the read control signal RD_CNT or the write control signal WT_CNT. The memory core circuit 16 may output the read data DATA_RD and the read parity P_RD from a memory array (not illustrated) included therein, in the case where the read control signal RD_CNT is enabled in a read operation. The read parity P_RD may be generated by employing an error correction code scheme using a Hamming code. The memory core circuit 16 may store the scrub data DATA_SCR in a memory array (not illustrated) included therein, in the case where the write control signal WT_CNT is enabled by the scrub write control signal WT_SCR. The scrub data DATA_SCR may be stored in a memory array the same as the memory array from which the read data DATA_RD is outputted.

Figure 2:
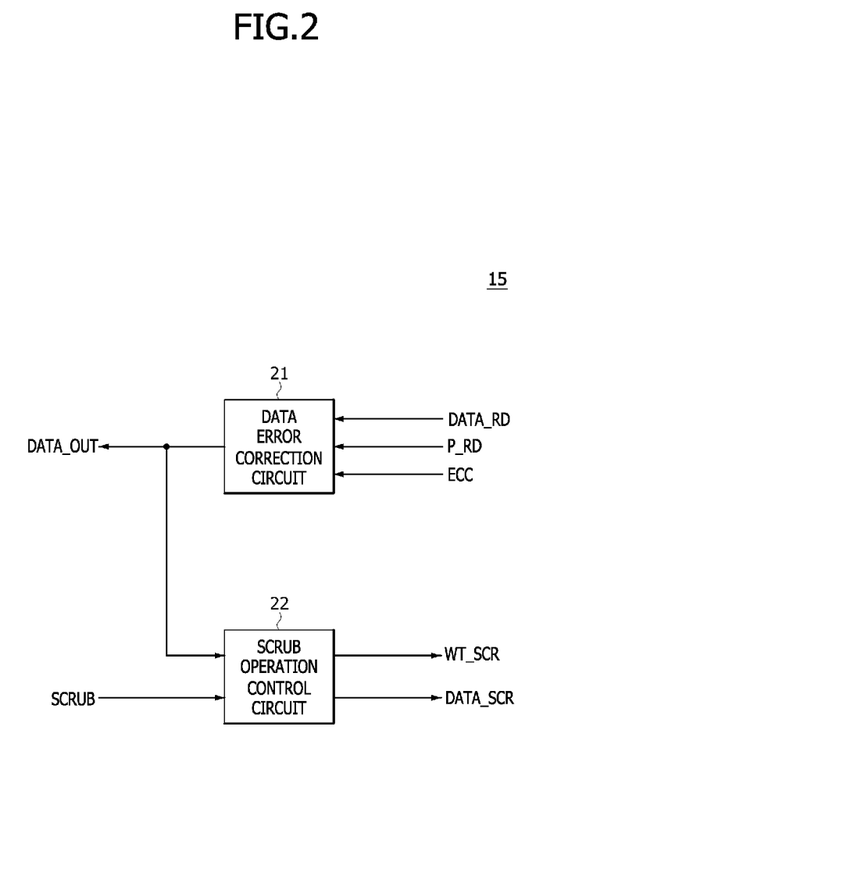
FIG. 2 is a block diagram illustrating a representation of an example of the error correction circuit included in the semiconductor system illustrated in FIG. 1.

Referring to FIG. 2, the error correction circuit 15 may include a data error correction circuit 21 and a scrub operation control circuit 22.

The data error correction circuit 21 may correct an error of the read data DATA_RD according to the read parity P_RD and output the output data DATA_OUT, in response to the error correction control signal ECC. The data error correction circuit 21 may correct an error of the read data DATA_RD according to the read parity P_RD and output the output data DATA_OUT, in the case where the error correction control signal ECC is enabled. The data error correction circuit 21 may buffer the read data DATA_RD and output the output data DATA_OUT, in the case where the error correction control signal ECC is disabled.

The scrub operation control circuit 22 may generate the scrub write control signal WT_SCR and generate the scrub data DATA_SCR by buffering the output data DATA_OUT, in response to the scrub control signal SCRUB. The scrub operation control circuit 22 may generate the scrub write control signal WT_SCR and generate the scrub data DATA_SCR by buffering the output data DATA_OUT, in the case where the scrub control signal SCRUB is enabled. The scrub operation control circuit 22 may block the generation of the scrub write control signal WT_SCR and the scrub data DATA_SCR, in the case where the scrub control signal SCRUB is disabled.

As described above, the semiconductor system in accordance with an embodiment may control an error correction operation and a scrub operation depending upon an internal temperature in a read operation. In the case where an internal temperature is equal to or higher than the first predetermined temperature in a read operation, the error correction control signal ECC which is enabled may be generated, an error of the read data DATA_RD may be corrected, and the output data DATA_OUT may be outputted. In the case where an internal temperature is equal to or higher than the second predetermined temperature in a read operation, the error correction control signal ECC and the scrub control signal SCRUB which are enabled may be generated, an error of the read data DATA_RD may be corrected and the output data DATA_OUT may be outputted, and the output data DATA_OUT may be buffered and the scrub data DATA_SCR may be generated. That is to say, in the case where an internal temperature is low, since an error occurrence rate becomes low, an operating speed and power consumption may be improved even without performing an error correction operation and a scrub operation. In the case where an internal temperature is high, since an error occurrence rate becomes high, reliability of data may be improved by performing an error correction operation and a scrub operation.

Figure 3:
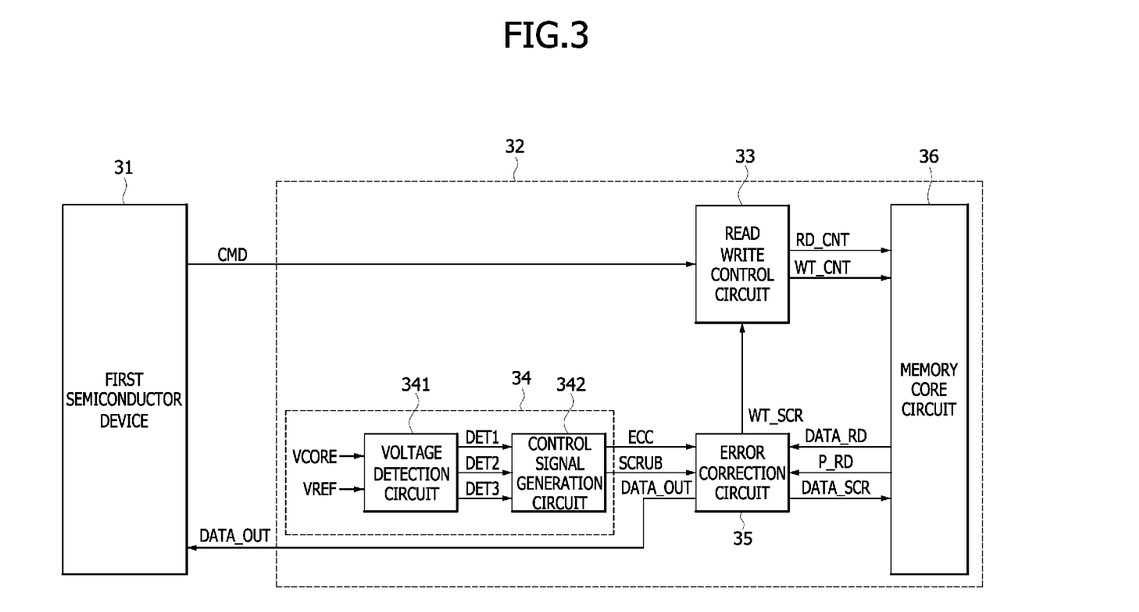
FIG. 3 is a block diagram illustrating a representation of an example of the configuration of a semiconductor system in accordance with an embodiment.

Referring to FIG. 3, a semiconductor system in accordance with an embodiment may include a first semiconductor device 31 and a second semiconductor device 32.

The first semiconductor device 31 may output a command CMD. The command CMD may include a plurality of bits according to an embodiment. The bits included in the command CMD may have logic level combinations corresponding to a read operation, a write operation and a refresh operation of the second semiconductor device 32. The command CMD may be transmitted through the same transmission line as an address (not illustrated), or may be transmitted through a separate transmission line from an address. The first semiconductor device 31 may be inputted with output data DATA_OUT. The output data DATA_OUT may be data outputted from the second semiconductor device 32 in the case where a read operation for the second semiconductor device 32 is performed.

The second semiconductor device 32 may include a read write control circuit 33, an operation control circuit 34, an error correction circuit 35, and a memory core circuit 36.

The read write control circuit 33 may decode the command CMD, and generate a read control signal RD_CNT and a write control signal WT_CNT. The read write control circuit 33 may decode the command CMD, and generate the read control signal RD_CNT which is enabled in the case where a read operation is to be performed. The read write control circuit 33 may decode the command CMD, and generate the write control signal WT_CNT which is enabled in the case where a write operation is to be performed. The read write control circuit 33 may generate the write control signal WT_CNT in response to a scrub write control signal WT_SCR. The read write control circuit 33 may generate the write control signal WT_CNT which is enabled in the case where the scrub write control signal WT_SCR is enabled.

The operation control circuit 34 may include a voltage detection circuit 341 and a control signal generation circuit 342.

The voltage detection circuit 341 may generate first to third detection signals DET1, DET2 and DET3 which are enabled depending upon a level of a core voltage VCORE. The voltage detection circuit 341 may generate the first detection signal DET1 which is enabled, in the case where a level of the core voltage VCORE is equal to or higher than a reference voltage VREF. The voltage detection circuit 341 may generate the second detection signal DET2 which is enabled, in the case where a level of the core voltage VCORE is lower, by a level equal to or lower than the level of a predetermined voltage, than the reference voltage VREF. The voltage detection circuit 341 may generate the third detection signal DET3 which is enabled, in the case where a level of the core voltage VCORE is lower, by a level higher than the level of the predetermined voltage, than the reference voltage VREF. For example, in the case where the level of the reference voltage VREF is 1V and the level of the predetermined voltage is 0.1V, the voltage detection circuit 341 may generate the first detection signal DET1 which is enabled when a level of the core voltage VCORE is equal to or higher than 1V, generate the second detection signal DET2 which is enabled when a level of the core voltage VCORE is lower than 1V and is equal to or higher than 0.9V, and generate the third detection signal DET3 which is enabled when a level of the core voltage VCORE is lower than 0.9V. The levels of the reference voltage VREF and the predetermined voltage may be set variously depending upon an embodiment.

The control signal generation circuit 342 may generate an error correction control signal ECC and a scrub control signal SCRUB in response to the first to third detection signals DET1, DET2 and DET3. The control signal generation circuit 342 may generate the error correction control signal ECC and the scrub control signal SCRUB which are disabled, in the case where the first detection signal DET1 is enabled. The control signal generation circuit 342 may generate the error correction control signal ECC which is enabled and the scrub control signal SCRUB which is disabled, in the case where the second detection signal DET2 is enabled. The control signal generation circuit 342 may generate the error correction control signal ECC and the scrub control signal SCRUB which are enabled, in the case where the third detection signal DET3 is enabled.

The error correction circuit 35 may receive read data DATA_RD and a read parity P_RD in response to the error correction control signal ECC and the scrub control signal SCRUB, and generate the output data DATA_OUT, scrub data DATA_SCR and the scrub write control signal WT_SCR. The error correction circuit 35 may buffer the read data DATA_RD and generate the output data DATA_OUT, in the case where the error correction control signal ECC is disabled. The error correction circuit 35 may correct an error of the read data DATA_RD according to the read parity P_RD and generate the output data DATA_OUT, in the case where the error correction control signal ECC is enabled. The error correction circuit 35 may generate the scrub write control signal WT_SCR and generate the scrub data DATA_SCR by buffering the output data DATA_OUT, in the case where the scrub control signal SCRUB is enabled.

The memory core circuit 36 may output the read data DATA_RD and the read parity P_RD or be inputted with the scrub data DATA_SCR in response to the read control signal RD_CNT or the write control signal WT_CNT. The memory core circuit 36 may output the read data DATA_RD and the read parity P_RD from a memory array (not illustrated) included therein, in the case where the read control signal RD_CNT is enabled in a read operation. The memory core circuit 36 may store the scrub data DATA_SCR in a memory array (not illustrated) included therein, in the case where the write control signal WT_CNT is enabled by the scrub write control signal WT_SCR. The scrub data DATA_SCR may be stored in a memory array the same as the memory array from which the read data DATA_RD is outputted.

As described above, the semiconductor system in accordance with an embodiment illustrated in FIG. 3 may control an error correction operation and a scrub operation depending upon a level of the core voltage VCORE in a read operation. In the case where a level of the core voltage VCORE is lower than the level of the reference voltage VREF in a read operation, the error correction control signal ECC which is enabled may be generated, an error of the read data DATA_RD may be corrected, and the output data DATA_OUT may be outputted. In the case where a level of the core voltage VCORE is lower than a level obtained by subtracting the level of the predetermined voltage from the level of the reference voltage VREF in a read operation, the error correction control signal ECC and the scrub control signal SCRUB which are enabled may be generated, an error of the read data DATA_RD may be corrected and the output data DATA_OUT may be outputted, and the output data DATA_OUT may be buffered and the scrub data DATA_SCR may be generated. That is to say, in the case where a level of the core voltage VCORE retains a stable voltage level equal to or higher than the reference voltage VREF, since an error occurrence rate becomes low, an operating speed and power consumption may be improved even without performing an error correction operation and a scrub operation. In the case where a level of the core voltage VCORE is low, since an error occurrence rate becomes high, reliability of data may be improved by performing an error correction operation and a scrub operation.

The semiconductor devices and the semiconductor systems described above with reference to FIGS. 1 to 3 may be applied to an electronic system which may include a memory system, a graphic system, a computing system or a mobile system. For example, referring to FIG. 4, an electronic system 1000 in accordance with an embodiment may include a data storage 1001, a memory controller 1002, a buffer memory 1003, and an input and output (input/output) (I/O) interface 1004.

Figure 4:
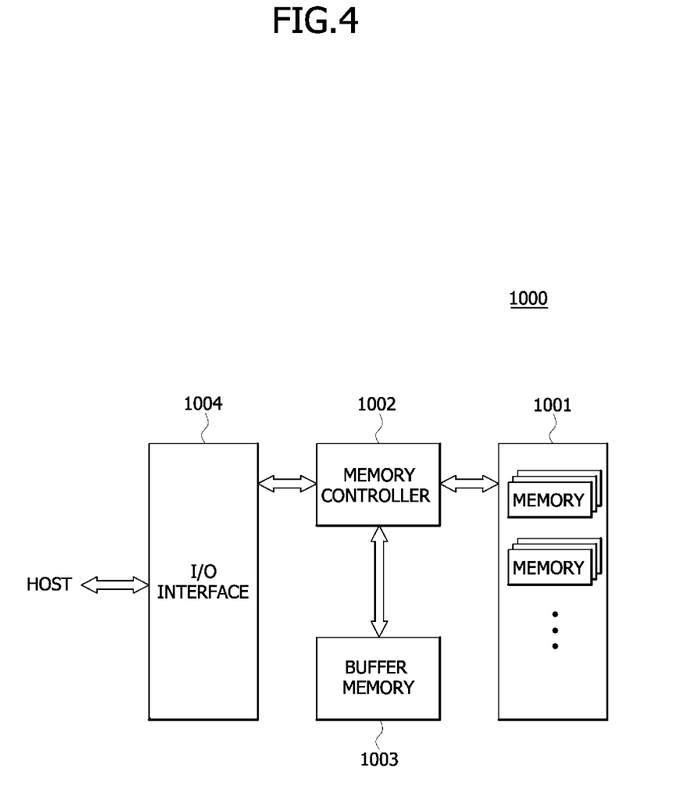
FIGS. 4 and 5 are block diagrams illustrating representations of examples of the configurations of electronic systems to which the semiconductor systems illustrated in FIGS. 1 to 3 may be applied.

The data storage 1001 stores data applied from the memory controller 1002, and reads out stored data and outputs the read-out data to the memory controller 1002, according to control signals from the memory controller 1002. The data storage 1001 may include the second semiconductor devices 12 illustrated in FIG. 1 or the second semiconductor devices 32 illustrated in FIG. 3. The data storage 1001 may include a nonvolatile memory capable of not losing and continuously storing data even though the power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM), etc.

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor devices 11 illustrated in FIG. 1 or the first semiconductor devices 31 illustrated in FIG. 3. While the memory controller 1002 is illustrated as one block in FIG. 4, a controller for controlling the data storage 1001 as a nonvolatile memory and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory), etc.

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE, etc.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card, etc.

Figure 5:
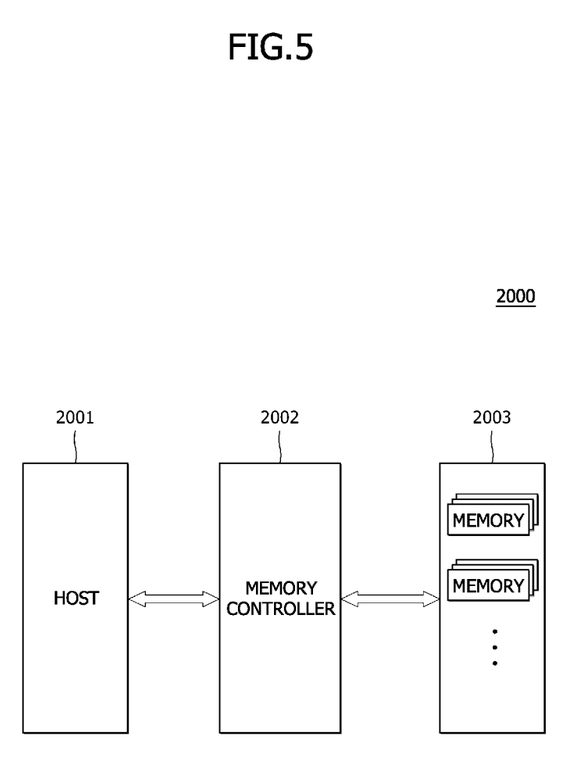

Referring to FIG. 5, an electronic system 2000 in accordance with an embodiment may include a host 2001, a memory controller 2002, and a data storage 2003.

The host 2001 may transmit a request and data to the memory controller 2002 to access the data storage 2003. The memory controller 2002 may provide data, a data strobe, a command, an address and a clock to the data storage 2003 in response to the request, and in response to this, the data storage 2003 may perform a write or read operation. The host 2001 may transmit data to the memory controller 2002 to store the data in the data storage 2003. Also, the host 2001 may receive, through the memory controller 2002, the data outputted from the data storage 2003. The host 2001 may include a circuit which corrects an error included in data, by using an error correction code (ECC) scheme.

The memory controller 2002 may relay communication between the host 2001 and the data storage 2003. The memory controller 2002 may receive a request and data from the host 2002. In order to control the operation of the data storage 2003, the memory controller 2002 may generate data, a data strobe, a command, an address and a clock, and provide them to the data storage 2003. The memory controller 2002 may provide the data outputted from the data storage 2003, to the host 2001.

The data storage 2003 may include a plurality of memories. The data storage 2003 may receive data, a data strobe, a command, an address and a clock from the memory controller 2002, and perform a write or read operation. Each of the plurality of memories included in the data storage 2003 may include a circuit which corrects an error included in data, by using the error correction code (ECC) scheme.

The error correction circuit included in the host 2001 and the error correction circuits included in the plurality of memories may be realized to operate all together or operate selectively, according to the embodiments. The host 2001 and the memory controller 2002 may be realized by the same chip according to an embodiment. The memory controller 2002 and the data storage 2003 may be realized by the same chip according to an embodiment. In an embodiment, the memory controller 2002 and or the data storage 2003 may include the semiconductor devices or systems associated with FIGS. 1-4.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor device comprising:
   an operation control circuit configured for generating a first signal based on an internal temperature being equal to or higher than a first predetermined temperature;
   an error correction circuit configured for correcting an error of read data according to a read parity and generating output data based on the error correction control signal; and
   a memory array configured to output the read data and the read parity to the error correction circuit based on a read operation,
   wherein the operation control circuit is configured to generate a second signal based on the internal temperature being equal to or higher than a second predetermined temperature,
   wherein the first predetermined temperature is different from the second predetermined temperature,
   wherein the operation control circuit comprises a temperature sensor, and
   wherein the temperature sensor generates the first detection signal which is enabled, based on the internal temperature being lower than the first predetermined temperature, generates the second detection signal which is enabled, based on the internal temperature being equal to or higher than the first predetermined temperature and being lower than the second predetermined temperature, and generates the third detection signal which is enabled, based on the internal temperature being equal to or higher than the second predetermined temperature.

2. The semiconductor device according to claim 1, wherein the first signal includes an error correction control signal and the second signal includes the error correction control signal and a scrub control signal.

3. The semiconductor device according to claim 2, wherein the second predetermined temperature is set to be higher than the first predetermined temperature.

4. The semiconductor device according to claim 2, wherein the error correction circuit generates a scrub write control signal and generates scrub data by buffering the output data, based on the scrub control signal.

5. The semiconductor device according to claim 2, wherein the operation control circuit comprises:
   a control signal generation circuit configured for generating the error correction control signal and the scrub control signal based on the first to third detection signals.

6. The semiconductor device according to claim 5, wherein the temperature sensor generates the first detection signal which is enabled, based on the internal temperature being lower than the first predetermined temperature, generates the second detection signal which is enabled, based on the internal temperature being equal to or higher than the first predetermined temperature and being lower than the second predetermined temperature, and generates the third detection signal which is enabled, based on the internal temperature being equal to or higher than the second predetermined temperature.

7. The semiconductor device according to claim 5, wherein the control signal generation circuit generates the error correction control signal based on the second detection signal being enabled, and generates the error correction control signal and the scrub control signal based on the third detection signal being enabled.

8. The semiconductor device according to claim 2, wherein the error correction circuit comprises:
- a data error correction circuit configured for correcting an error of the read data according to the read parity and outputting the output data, based on the error correction control signal; and
- a scrub operation control circuit configured for generating the scrub write control signal and generating the scrub data by buffering the output data, based on the scrub control signal.

9. The semiconductor device according to claim 1, further comprising:
- a read write control circuit configured for generating a read control signal or a write control signal by decoding a command or generating a write control signal based on the scrub write control signal; and
- a memory core circuit including the memory array, and configured for outputting the read data and the read parity from the memory array based on the read control signal and storing the scrub data in the memory array based on the write control signal.

10. A semiconductor device comprising:
- an operation control circuit configured for generating a first signal based on a level of a core voltage being lower than a level of a reference voltage; and
- an error correction circuit configured for correcting an error of read data according to a read parity and generating output data based on the first signal; and
- a memory array configured to output the read data and the read parity to the error correction circuit based on a read operation,
- wherein the operation control circuit is configured to generate a second signal based on the level of the core voltage being lower than a level obtained by subtracting a level of a predetermined voltage from the level of the reference voltage,
- wherein the operation control circuit comprises a voltage detection circuit, and
- wherein the voltage detection circuit generates the first detection signal which is enabled, based on the level of the core voltage being equal to or higher than the level of the reference voltage, generates the second detection signal which is enabled, based on the level of the core voltage being lower than the level of the reference voltage and being equal to or higher than the level obtained by subtracting the level of the predetermined voltage from the level of the reference voltage, and generates the third detection signal which is enabled, based on the level of the core voltage being lower than the level obtained by subtracting the level of the predetermined voltage from the level of the reference voltage.

11. The semiconductor device according to claim 10, wherein the first signal includes an error correction control signal and the second signal includes the error correction control signal and a scrub control signal.

12. The semiconductor device according to claim 11, wherein the error correction circuit generates a scrub write control signal and generates scrub data by buffering the output data, based on the scrub control signal.

13. The semiconductor device according to claim 11, wherein the operation control circuit comprises:
- a control signal generation circuit configured for generating the error correction control signal and the scrub control signal based on the first to third detection signals.

14. The semiconductor device according to claim 13, wherein the control signal generation circuit generates the error correction control signal based on the second detection signal being enabled, and generates the error correction control signal and the scrub control signal based on the third detection signal being enabled.

15. The semiconductor device according to claim 10, further comprising:
- a read write control circuit configured for generating a read control signal or a write control signal by decoding a command or generating a write control signal based on the scrub write control signal; and
- a memory core circuit including the memory array, and configured for outputting the read data and the read parity from the memory array based on the read control signal and storing the scrub data in the memory array based on the write control signal.

16. A semiconductor system comprising:
- a first semiconductor device configured for outputting a command and being inputted with output data; and
- a second semiconductor device configured for generating a first signal and a second signal depending upon an internal temperature or a level of a core voltage, and generating the output data by correcting an error of read data according to a read parity based on the first signal, based on a read operation being performed based on the command,
- wherein the read parity and the read data are outputted from a memory array, included in the second semiconductor device, in the read operation,
- wherein the second semiconductor device is configured to generate the first signal based on the internal temperature being equal to or higher than a first predetermined temperature and to generate the second signal based on the internal temperature being equal to or higher than a second predetermined temperature,
- wherein the first predetermined temperature is different from the second predetermined temperature,
- wherein the second semiconductor device comprises a temperature sensor, and
- wherein the temperature sensor generates the first detection signal which is enabled, based on the internal temperature being lower than the first predetermined temperature, generates the second detection signal which is enabled, based on the internal temperature being equal to or higher than the first predetermined temperature and being lower than the second predetermined temperature, and generates the third detection signal which is enabled, based on the internal temperature being equal to or higher than the second predetermined temperature.

17. The semiconductor system according to claim 16,
- wherein the first signal includes an error correction control signal and the second signal includes the error correction control signal and a scrub control signal, and
- wherein the second predetermined temperature is set to be higher than the first predetermined temperature.

18. The semiconductor system according to claim 17, wherein the second semiconductor device generates the error correction control signal based on the level of the core voltage being lower than a level of a reference voltage, and generates the scrub control signal based on the level of the core voltage being lower than a level obtained by subtracting a level of a predetermined voltage from the level of the reference voltage.

19. The semiconductor system according to claim 16, wherein the second semiconductor device generates scrub data by buffering the output data based on the scrub control signal, and stores the scrub data in the memory array.

20. A semiconductor device comprising:
an operation control circuit configured to generate a first to third detection signals based on an internal temperature of the semiconductor device; and
an error correction circuit configured to output read data as output data with or without performing an error correction operation and with or without performing a scrub operation based on the first to third detection signals,
wherein the operation control circuit is configured to generate the second detection signal based on the internal temperature being equal to or higher than a first predetermined temperature and to generate the third detection signal based on the internal temperature being equal to or higher than a second predetermined temperature, and
wherein the first predetermined temperature is different from the second predetermined temperature.

21. The semiconductor device according to claim 20, wherein when the internal temperature is below the first predetermined temperature the error correction circuit is configured to output the read data as the output data without performing the error correction operation and without performing the scrub operation.

22. The semiconductor device according to claim 20,
wherein when the internal temperature is greater than or equal to a first predetermined temperature and less than the second predetermined temperature the error correction circuit is configured to output the read data as the output data with performing the error correction operation and without performing the scrub operation, and
wherein the second predetermined temperature is set to be greater than the first predetermined temperature.

23. The semiconductor device according to claim 20,
wherein when the internal temperature is greater than a first and a second predetermined temperature the error correction circuit is configured to output the read data as the output data with performing the error correction operation and with performing the scrub operation, and
wherein the second predetermined temperature is set to be greater than the first predetermined temperature.

24. The semiconductor device according to claim 20,
wherein the error correction operation includes correcting an error of the read data according to a read parity and generating the output data, and
wherein the scrub operation includes generating scrub data by buffering the output data.

25. A semiconductor device comprising:
an operation control circuit configured to generate a first to third detection signals based on a level of a core voltage of the semiconductor device; and
an error correction circuit configured to output read data as output data with or without performing an error correction operation and with or without performing a scrub operation based on the first to third detection signals,
wherein the operation control circuit is configured to generate the second detection signal based on a level of a core voltage being lower than a level of a reference voltage and to generate the third detection signal based on the level of the core voltage being lower than a level obtained by subtracting a level of a predetermined voltage from the level of the reference voltage.

26. The semiconductor device according to claim 25,
wherein when the level of the core voltage is equal to or higher than the reference voltage the error correction circuit is configured to output the read data as the output data without performing the error correction operation and without performing the scrub operation.

27. The semiconductor device according to claim 25,
wherein when the level of the core voltage is lower, by a level equal to or lower than the level of the predetermined voltage, than the reference voltage the error correction circuit is configured to output the read data as the output data with performing the error correction operation and without performing the scrub operation.

28. The semiconductor device according to claim 25,
wherein when the level of the core voltage is lower, by a level higher than the level of the predetermined voltage, than the reference voltage the error correction circuit is configured to output the read data as the output data with performing the error correction operation and with performing the scrub operation.

29. The semiconductor device according to claim 25,
wherein the error correction operation includes correcting an error of the read data according to a read parity and generating the output data, and
wherein the scrub operation includes generating scrub data by buffering the output data.

* * * * *